(12) United States Patent
Suy et al.

(10) Patent No.: US 11,885,692 B2
(45) Date of Patent: Jan. 30, 2024

(54) ARRANGEMENT AND METHOD FOR CALIBRATING TEMPERATURE SENSORS

(71) Applicant: SCIOSENSE B.V., AE Eindhoven (NL)

(72) Inventors: Hilco Suy, AE Eindhoven (NL); Frans De Jong, AE Eindhoven (NL); Agata Sakic, AE Eindhoven (NL); Nebojsa Nenadovic, AE Eindhoven (NL); Geert Calaerts, AE Eindhoven (NL); Hans Ten Cate, AE Eindhoven (NL); Renie De Kok, AE Eindhoven (NL); Andreis Valter, AE Eindhoven (NL)

(73) Assignee: Sciosense B.V., AE Eindhoven (NL)

( * ) Notice: Subject to any disclaimer, the term of this patent is extended or adjusted under 35 U.S.C. 154(b) by 618 days.

(21) Appl. No.: 16/975,936

(22) PCT Filed: Feb. 26, 2019

(86) PCT No.: PCT/EP2019/054725
§ 371 (c)(1),
(2) Date: Aug. 26, 2020

(87) PCT Pub. No.: WO2019/185259
PCT Pub. Date: Oct. 3, 2019

(65) Prior Publication Data
US 2021/0364372 A1  Nov. 25, 2021

(30) Foreign Application Priority Data

Mar. 26, 2018 (EP) .................................... 18163982

(51) Int. Cl.
*G01K 15/00* (2006.01)
*G01R 31/69* (2020.01)
*G01K 5/28* (2006.01)

(52) U.S. Cl.
CPC ........... *G01K 15/005* (2013.01); *G01R 31/69* (2020.01); *G01K 5/28* (2013.01)

(58) Field of Classification Search
CPC ........ G01K 15/005; G01K 5/28; G01K 15/00; G01K 15/002; G01R 31/69; G01R 1/0458; G01R 31/2863; G01R 31/26; G01R 1/00
(Continued)

(56) References Cited

U.S. PATENT DOCUMENTS 3,216,236 A * 11/1965 Rohrbach .......... G05D 23/1906
                                                                  374/3
3,270,547 A *  9/1966 Macritchie ............. G01K 15/00
                                                                  374/182
(Continued)

FOREIGN PATENT DOCUMENTS

CN       101750170 A  *  6/2010
CN       101750170 A     6/2010
(Continued)

OTHER PUBLICATIONS

European Patent Office, International Search Report for PCT/EP2019/054725 dated May 20, 2019.

*Primary Examiner* — Gail Kaplan Verbitsky
(74) *Attorney, Agent, or Firm* — Slater Matsil, LLP

(57) ABSTRACT

A calibration arrangement has a sealable and thermally-isolated chamber comprising a socket mount having a number of reference samples in thermal contact with the socket mount and a number of sample sockets for devices-under test, DUTs, with each sample socket being arranged in proximity to and associated to at least one of the reference samples. The arrangement further comprises a thermal chuck and a circuit board, which is configured to provide electrical connection to the reference samples in the socket mount and DUTs in the sample sockets. The thermal chuck
(Continued)

is configured to thermalize the socket mount and the circuit board to a temperature set point.

15 Claims, 3 Drawing Sheets

(58) Field of Classification Search
USPC .................................................. 374/1; 702/99
See application file for complete search history.

(56) References Cited

U.S. PATENT DOCUMENTS

| | | | | |
|---|---|---|---|---|
| 5,439,291 A | * | 8/1995 | Reading | G01N 25/4866 |
| | | | | 374/33 |
| 6,193,411 B1 | * | 2/2001 | Chen | G01K 15/005 |
| | | | | 374/2 |
| 6,492,797 B1 | * | 12/2002 | Maassen | G01R 31/3191 |
| | | | | 324/74 |
| 6,551,835 B1 | * | 4/2003 | Schawe | G01N 25/4833 |
| | | | | 374/10 |
| 6,709,152 B1 | * | 3/2004 | Bronlund | G01K 15/00 |
| | | | | 374/2 |
| 7,547,137 B2 | * | 6/2009 | Nakamura | G01N 25/20 |
| | | | | 374/102 |
| 7,888,951 B2 | | 2/2011 | Lupashku et al. | |
| 8,529,126 B2 | | 9/2013 | Engelstad et al. | |
| 9,857,241 B2 | * | 1/2018 | Danley | G01K 17/08 |
| 2007/0206653 A1 | * | 9/2007 | Nakano | G01K 15/005 |
| | | | | 374/1 |
| 2008/0013591 A1 | * | 1/2008 | Kim | G01K 15/002 |
| | | | | 374/1 |
| 2009/0201968 A1 | * | 8/2009 | Schulze | G01K 15/00 |
| | | | | 374/1 |
| 2014/0361798 A1 | * | 12/2014 | Johnson | G01R 35/005 |
| | | | | 324/750.02 |
| 2015/0338289 A1 | | 11/2015 | Friedrichs | |
| 2016/0320252 A1 | | 11/2016 | Ostermeyer et al. | |

FOREIGN PATENT DOCUMENTS

| | | | | |
|---|---|---|---|---|
| CN | 102177425 A | | 9/2011 | |
| CN | 102317802 A | | 1/2012 | |
| CN | 102803912 A | | 11/2012 | |
| CN | 102435351 | | 11/2013 | |
| CN | 102375114 B | * | 12/2013 | |
| CN | 102539018 | | 12/2013 | |
| CN | 206496853 U | | 9/2017 | |
| DE | 102009038343 A1 | * | 8/2011 | ......... G01N 25/4866 |
| DE | 102021113791 A1 | * | 12/2022 | |
| EP | 1857797 A1 | * | 11/2007 | ................ G01J 5/16 |
| EP | 3299803 A1 | * | 3/2018 | ............. G01N 25/18 |
| FR | 2582399 A1 | * | 11/1986 | |
| TW | 494244 B | | 7/2002 | |

* cited by examiner

ARRANGEMENT AND METHOD FOR CALIBRATING TEMPERATURE SENSORS

CROSS-REFERENCE TO RELATED APPLICATIONS

The present application is the national stage entry of International Patent Application No. PCT/EP2019/054725, filed on Feb. 26, 2019, which claims the benefit of priority of European Patent Application No. 18163982.4, filed on Mar. 26, 2018, all of which are hereby incorporated by reference in their entirety for all purposes.

BACKGROUND OF THE INVENTION

The present disclosure relates to an arrangement and a method for calibrating sensors.

High-accuracy temperature sensors are utilized in a large variety of applications in which it is required to monitor the temperature with high accuracy. For example, reliable body temperature measurements require an accuracy of less than 100 mK. To provide temperature sensors with this high level of accuracy, a reliable way of calibrating newly fabricated temperature sensors is required. The calibration process of high accuracy temperature sensors typically involves several hours of stabilization in a highly-controlled temperature-stable environment.

SUMMARY OF THE INVENTION

This disclosure provides an improved concept for calibrating temperature sensors.

The improved concept is based on the idea of a calibration arrangement featuring fast thermalization of devices-under-test, DUTs, while avoiding temperature gradients to achieve a more accurate calibration. To this end, the improved concept is realized by a calibration arrangement that is characterized by having a sufficiently small distance between the DUTs, for example CMOS temperature sensors, that are to be calibrated and reference samples used for the calibration process. With such an arrangement the calibration process of temperature sensors can be performed with high accuracy within short time periods, for example within several seconds, and with high parallelism, i.e. simultaneous calibration of a large number of sensors, for example several hundreds of sensors at once.

In particular, the improved concept proposes a calibration arrangement comprising a sealable and thermally isolated chamber, in which a socket mount, a circuit board and a thermal chuck are arranged.

The socket mount comprises a number of temperature reference samples, which are in thermal contact with the socket mount. The socket mount further comprises a number of sample sockets for DUTs, wherein each sample socket is arranged in proximity to and associated to at least one of the reference samples. In such an arrangement each of the DUTs can be calibrated by means of N reference samples, with N being an integer number leading to a ratio 1:N between the number of DUTs and the number of reference samples. Typically, N is between one and four.

The circuit board is configured to provide electrical connection to the DUTs in the sample sockets and the reference samples in the socket mount. For example, the electrical connection is configured to provide a connection of the DUTs and the reference samples to a power supply and/or a readout circuit. The thermal chuck is arranged in thermal contact with the socket mount and the circuit board, and is configured to thermalize the socket mount and the circuit board to a temperature set point.

The improved concept further comprises a method for calibrating temperature sensors in such a calibration arrangement.

In various embodiments of the calibration arrangement according to the improved concept, the socket mount comprises additional sample sockets fur DUTs, wherein each of the additional sample sockets is arranged in proximity to and associated to the at least one of the reference samples.

Analogous to having multiple reference samples for each of the DUTs, conversely a number M of DUTs, with M being an integer number, may be calibrated by means of a single reference sample. In this case, the sample arrangement is described by a ratio M:1 between the number of DUTs and the number of reference samples. Likewise, M is typically between one and four.

In some embodiments, the arrangement of multiple DUTs per reference sample is combined with the converse case, leading to a ratio of M:N. For example, an arrangement of 2:2 can be chosen, in which two DUTs can each be calibrated by means of two reference samples.

In various embodiments of the calibration arrangement according to the improved concept, each of the sample sockets is arranged at a distance of less than 10 mm, in particular less than 5 mm, from the associated at least one of the reference samples.

Moreover, in some embodiments each of the sample sockets is arranged at the same distance from the associated at least one of the reference samples.

The proximity between the DUTs placed in the sample sockets and the reference samples ensures a short thermal path between them and hence allows for a reliable and accurate calibration of DUTs. The underlying principle for this is that, due to the proximity, each of the DUTs thermalizes to the same temperature as the at least one associated reference sample. Such a configuration therefore also compensates calibration errors due to possible temperature gradients across the calibration arrangement and offsets compared to the set point of the thermal chuck.

Having the same distance between each of the reference samples and each of the associated sample sockets further guarantees a consistent calibration of all DUTs placed in the sample sockets in terms of accuracy.

In some embodiments the reference samples are of the same type as the DUTs to be placed into the sample sockets. The advantage of such embodiments is that the DUTs and the reference samples show the same behavior, for example by means of thermalization behavior. In this way, the accuracy of the calibration process can be further enhanced. Moreover, in this case reference samples can easily be swapped with DUTs that are pre-calibrated in a lab setting against a very accurate and NIST-traceable reference.

In some embodiments the socket mount is made from a material with high thermal conductivity. Suitable materials include metals, such as, for instance, stainless steel or aluminum.

Especially for industrial production it is desirable to perform the calibration of temperature sensors not only with high parallelism but also within short time periods. To this end, a socket mount with high thermal conductivity substantially reduces the thermalization time of both DUTs placed in the sample sockets and the reference samples in the arrangement. In particular, the thermalization time can be reduced to a timescale of a few seconds, after which meaningful results of the calibration process can be obtained.

In some embodiments the calibration arrangement comprises a gas surrounding the socket mount. The calibration arrangement is further configured to thermalize the gas to the temperature set point in these embodiments. The arrangement may further be configured to operate at the given set point of the gas by means of pressure and/or relative humidity.

Operating the calibration arrangement with a gas surrounding DUTs placed in the sample sockets allows for the temperature calibration according to the designed purpose of the sensors regarding, for example, type of the gas, pressure and/or relative humidity.

Beyond that, in many cases DUTs feature more than one sensor per unit. Besides a temperature sensor, a DUT may for example comprise a gas sensor, relative humidity sensor and/or a pressure sensor. In such an embodiment the calibration of the DUTs by means of temperature can be extended by a calibration of gas sensing, relative humidity measurements and/or pressure measurements without the need for modifying the arrangement or disturbing its temperature equilibrium. In addition, accurate calibration of the DUTs by means of gas, relative humidity and/or pressure relies on the knowledge of the precise temperature, which can be obtained with the DUTs according to this embodiment.

In some embodiments the calibration arrangement further comprises an evaluation circuit, which is configured to generate, based on a temperature-dependent quantity, respective sets of measurement signals for each of the DUTs placed in the associated sample sockets. Each set of measurement signals hereby comprises a test measurement signal from a distinct one of the DUTs, and a reference measurement signal from the associated at least one of the reference samples.

The acquisition of measurement sets allows for the calibration of the DUTs by means of the associated reference samples via comparison of the test measurement signal and the reference measurement signals of the respective set of measurement signals.

In some embodiments the evaluation circuit is further configured to generate a calibration signal for each set of measurement signals. The calibration signal is hereby based on the result of the comparison between the test measurement signal and the reference measurement signals of the respective set of measurement signals.

Under the assumption that each of the DUTs in the sample sockets is thermalized to the same temperature as the associated at least one of the reference samples, the result of the comparison of the test measurement signal and the reference measurement signals can be used by means of the evaluation circuit to calibrate the respective DUT. The use of multiple reference samples for the calibration of each DUT can hereby further enhance the accuracy of the calibration process. On the other hand, having multiple DUTs associated to each reference samples allows for a larger number of DUTs that can be simultaneously calibrated in the arrangement.

In some embodiments the evaluation circuit is configured to generate the sets of measurement signals within a timeframe of less than 10 seconds.

Besides a fast thermalization of DUTs placed in the sample sockets, it is further desirable to likewise perform the actual calibration process in short timeframes, in particular within timeframes of less than 10 seconds.

In some embodiments the calibration arrangement further comprises an apparatus configured to exert a force on the DUTs in the sample sockets. The force vector hereby points in the direction of the sample sockets.

The apparatus in such an embodiment acts as a push mechanism forcing the DUTs into the sample sockets. This both enhances the thermal contact between the DUTs and the sample mount as well as ensures a sufficient electrical contact between contacts of the DUTs and contacts on the circuit board.

The aforementioned object is further solved by a method of calibrating temperature sensors in a calibration arrangement, for example according to one of the embodiments described above.

The method comprises arranging a number of devices under test, DUTs, in a sealable and thermally isolated chamber of the calibration arrangement such that each of the DUTs is in proximity to, associated to and in thermal contact with at least one of a number of reference samples. The method further comprises controlling the calibration arrangement to thermalize the DUTs and the reference samples to a temperature set point, and generating, based on a temperature-dependent quantity, sets of measurement signals for each of the DUTs. Each set of measurement signals comprises a test measurement signal from a distinct one of the DUTs and a reference measurement signal from each of the associated at least one of the reference samples.

In some embodiments the method further comprises the generation of a calibration signal for each pair of measurement signals based on a result of a comparison of the test measurement signal and the reference measurement signals of the respective set of measurement signals.

In some embodiments of the method each set of measurement signals is generated simultaneously or within a given timeframe.

Further embodiments of the method become apparent to the skilled reader from the embodiments of the calibration arrangement described above.

BRIEF DESCRIPTION OF THE DRAWINGS

The following description of figures of example embodiments may further illustrate and explain aspects of the improved concept. Elements and parts of the arrangement with the same structure and the same effect, respectively, appear with equivalent reference symbols. In so far as elements and parts of the arrangement correspond to one another in terms of their function in different figures, the description thereof is not repeated for each of the following figures.

DETAILED DESCRIPTION

Figure 1:
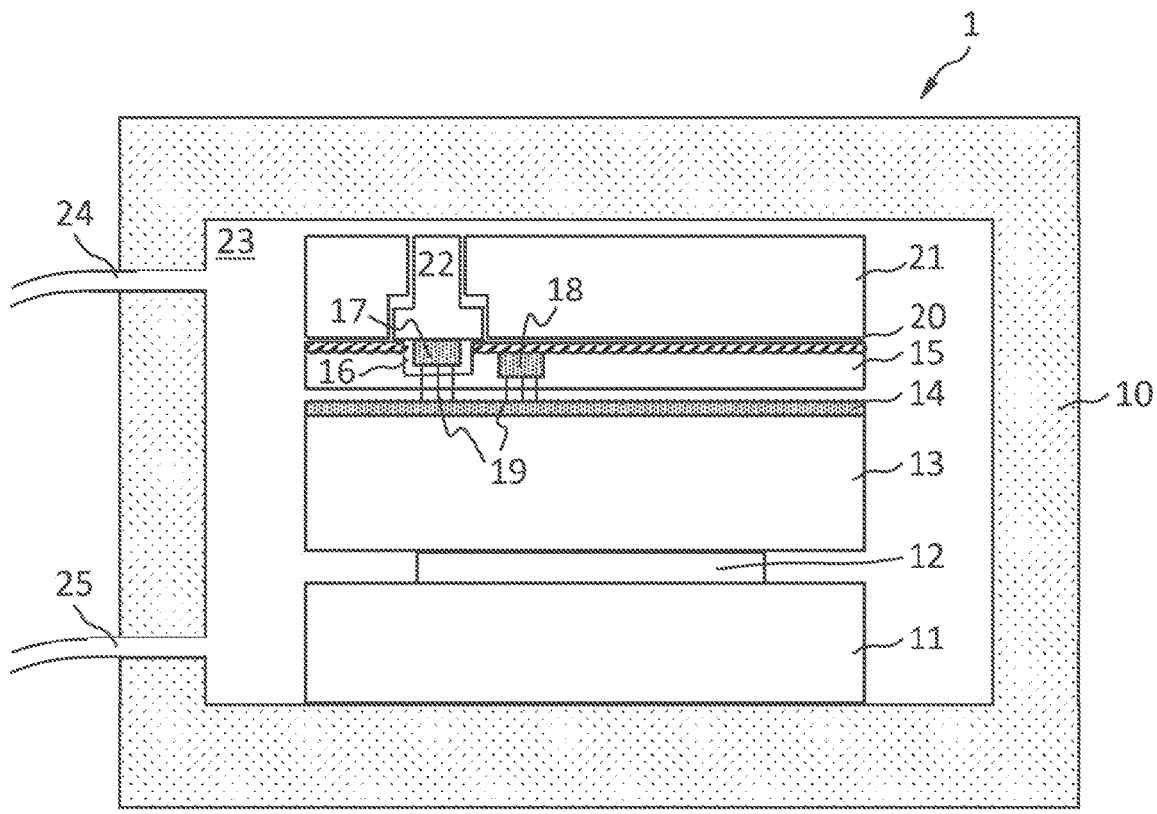
FIG. 1 shows an exemplary embodiment of a calibration arrangement according to the improved concept.

FIG. 1 shows the cross-section of an exemplary embodiment of a calibration arrangement 1 comprising a sealable and thermally isolated chamber 10. Components inside the chamber 10 are arranged in a stacked manner. In this example, the stack comprises from bottom to top: a thermal mass 11, a Peltier element 12, a thermal chuck 13 and circuit board 14. In other examples the stack might comprise additional components. The sample mount 15 with the sample sockets 16 is arranged above the circuit board 14. Also shown is a device-under-test, DUT, 17 placed inside the sample socket 16 as well as a reference sample 18. The reference samples are for example of the same type as the DUTs 17 and are calibrated with NIST-traceability. In this embodiment the reference samples are fixated and covered by a cover plate 20. A pushdown mechanism 22 provides thermal contact for the DUTs 17 as well as electrical contact between pogo pins 19 of the DUTs 17 and the circuit board 14. Additionally, a pushdown housing 21 thermally couples the pushdown mechanism 22 to the cover plate 20 and the sample mount 15. In this example, the chamber 10 further comprises a gas 23 surrounding the stack of components, in particular the DUTs 17 and reference samples 18. The gas is introduced for example by means of a temperature controlled gas inlet 24. The chamber further comprises a gas outlet 25.

The components of the arrangement 1, in particular the sample mount 15, the circuit board 14 and the surrounding gas 23, are thermalized to a temperature set point. The thermalization can for example be achieved by means of temperature control of heated walls of the chamber 10, the Peltier element 12 and a temperature controlled gas inlet 24. To ensure thermalization to the same temperature, the aforementioned components may be thermalized by a single temperature control. For example, the walls of the chamber 10 and the temperature controlled gas inlet 24 may be temperature controlled by means of a coolant liquid supplying both components.

For a reliable calibration process a large degree of temperature stability of the sample sockets 16 and the reference samples 18 is required. This is achieved by means of the thermal chuck 13, which is in thermal contact with the socket mount 15 and the circuit board 14. The thermal chuck is optionally made of a material with high thermal conductivity, for example a metal such as stainless steel or aluminum, and provides a large thermal mass in comparison to the DUTs 17. Due to the high thermal conductivity, DUTs 17 that are placed into the sample sockets 16 and pushed down by means of the pushdown mechanism 22 quickly thermalize to the temperature set point of the arrangement 1, for example within seconds. Due to their close proximity of a few millimeters causing a short thermal path and small thermal resistance, it is guaranteed that each of the DUTs 17 thermalizes to the same temperature as the associated reference sample 18. This condition holds true also in case of a temperature gradient across the individual components of the arrangement 1, which can for example be caused by a long thermal path and high thermal resistance between the sample sockets 16 and the Peltier element 12.

After the DUTs 17 and the reference samples 18 are thermalized, the actual calibration process can be performed. For example, an evaluation circuit which is electrically connected to the circuit board 14 generates, based on a temperature-dependent quantity, respective sets of measurement signals for each of the DUTs 17. In particular, each set of measurement signals comprises a test measurement signal from a distinct one of the DUTs 17 and a reference measurement signal from the associated at least one of the reference samples 18.

The evaluation circuit may comprise a memory, containing for example a look-up table for converting the test measurement signal and the reference measurement signals of each measurement set into units of temperature.

The evaluation circuit may further generate a calibration signal for each set of measurement signals, wherein each calibration signal corresponds to a result of a comparison of the test measurement signal and the reference measurement signals of the respective set of measurement signals. Each calibration signal can hence be used for calibrating the corresponding DUT 17 for accurate absolute temperature measurements. The achievable accuracies are below 100 mK, in particular below 50 mK at the temperature set point, and within 200 mK in a temperature range of ±50 K around the temperature set point.

In particular, the evaluation circuit is configured to generate each set of measurement signals simultaneously or within a given timeframe, for example within seconds. Preferably, also the calibration signals are generated within short time periods, i.e. within seconds.

In some applications, the DUTs 17 contain additional sensors in addition to a temperature sensor. Hence, a calibration of the additional sensors of the DUTs 17 in the calibration arrangement 1 may be desired without the need for modifying the arrangement or disturbing its temperature equilibrium.

Therefore, the arrangement 1 may be further configured to calibrate the additional sensors of the DUTs 17 by means of gas, relative humidity and/or pressure analogous to the temperature calibration. To this end, the temperature controlled gas inlet 24 is further configured to provide an active gas flow for introducing a specific gas 23 into the chamber and stabilize the gas 23 by means of relative humidity and/or pressure.

Figure 2:
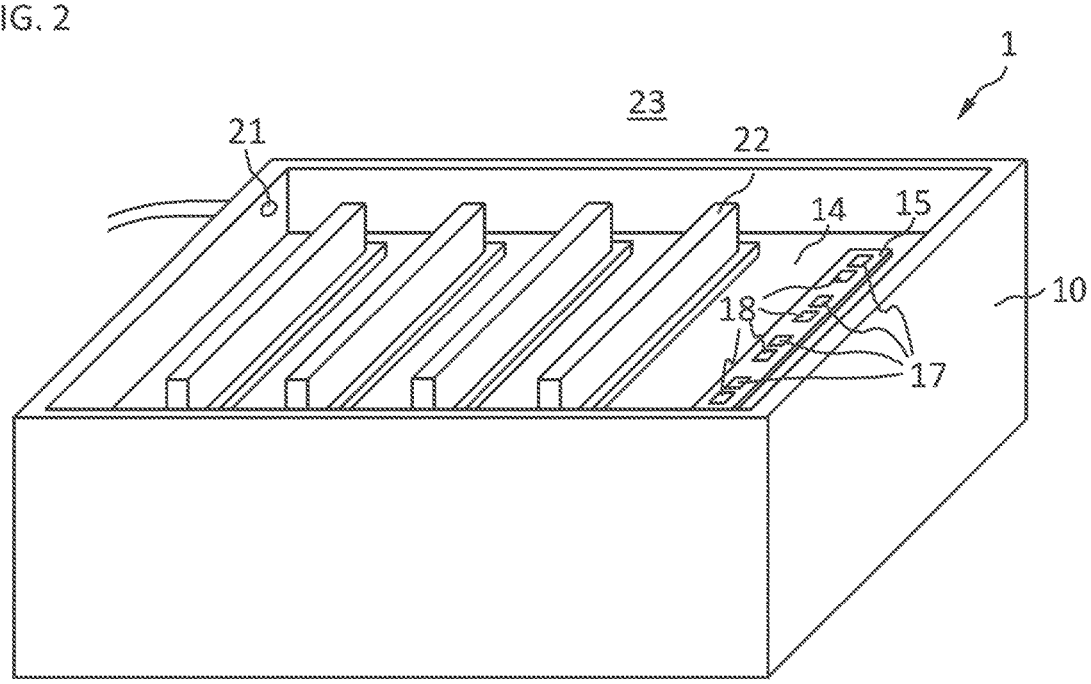
FIG. 2 shows a further exemplary embodiment of a calibration arrangement according to the improved concept.

FIG. 2 shows an exemplary embodiment of the arrangement 1 featuring the pairwise arrangement of the DUTs 17 and the reference samples 18 on the sample mounts 15. In particular, the chamber 10 may comprise more than one sample mount 15. In such an embodiment, the arrangement 1 may host a large number of DUTs 17, and a likewise large number reference samples 18, at the same time. For example the number of DUTs 17 that can be placed in the chamber may be in the order of 100.

Figure 3:
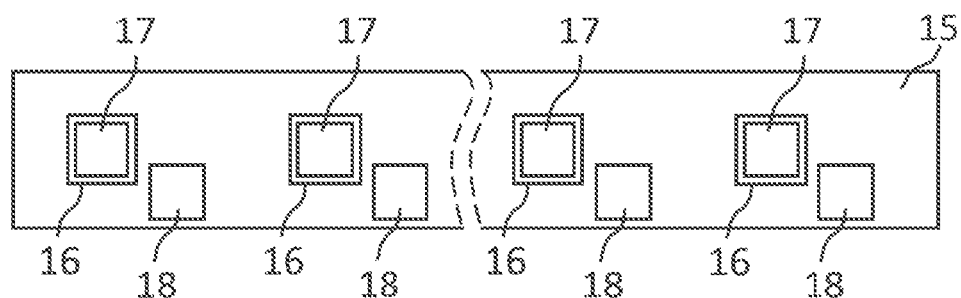
FIG. 3 shows an exemplary embodiment of a sample mount according to the improved concept.

FIG. 3 shows a schematic top view of an exemplary sample mount 15. The sample mount 15 in this example features a 1:1 arrangement of each of a number of reference samples 18 and a sample socket 16 in its proximity, in which a DUT 17 can be placed. The distance between each of the reference samples 18 and the associated sample socket 16 is the same across the entire sample mount 15. For example, this distance is less than 10 mm, in particular less than 5 mm. Assuming that the sample mount 15 is made from a material with high thermal conductivity, this setup allows for the fast thermalization of each reference sample 18 and a DUT 17 to the same temperature.

Figure 4:
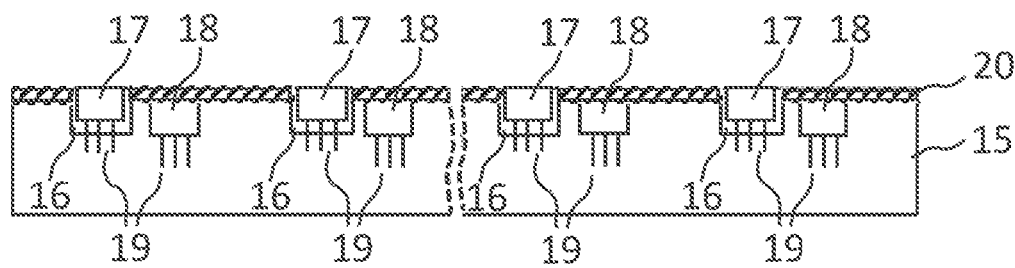
FIG. 4 shows a cross-section of the exemplary embodiment shown in FIG. 3.

FIG. 4 shows a cross section of the exemplary sample mount 15 shown in FIG. 3. In this cross-section, the cover plate 20 becomes apparent, covering the reference samples 18. This cover plate 20 has the effect of protecting the reference samples 18 and ensuring that the latter remain thermalized to the temperature set point while the chamber is exposed to the environment, for example during insertion of new DUTs 17 into the sample sockets 16.

Figure 5:
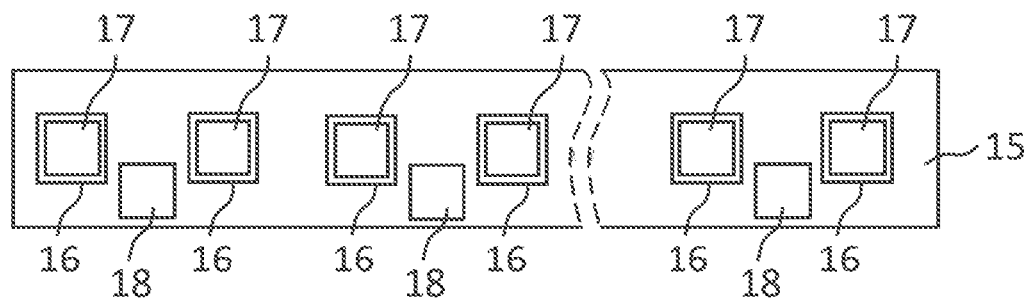
FIG. 5 shows a second exemplary embodiment of a sample mount according to the improved concept.

FIG. 5 shows a schematic top view of a further exemplary sample mount 15. In this case the ratio between reference samples 18 and sample mounts 16 is 1:2, leading to a situation in which two DUTs 17 placed into the respective sample sockets 16 can be calibrated by means of one single reference sample 18.

Other sample arrangements not shown may feature more than two sample sockets being associated to a reference sample, described by a ratio of 1:N. Typically, ratios of up to 1:4 are realized.

In further sample arrangements not shown more than one reference sample 18 may be associated to each of the DUTs 17 in the sample sockets 16, leading to a ratio of M:1, whereas typical ratios are as large as 4:1.

Figure 6:
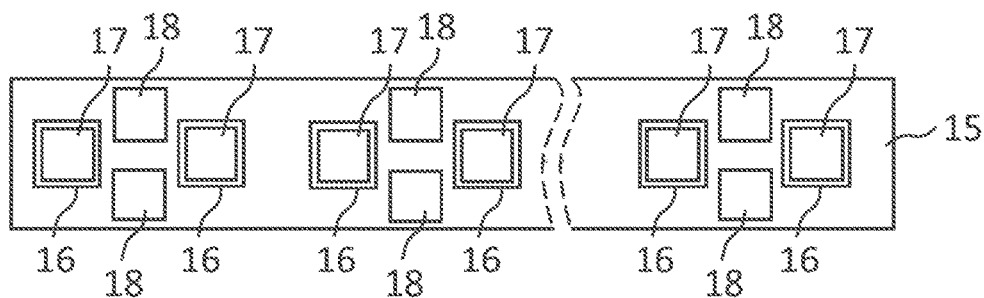
FIG. 6 shows a third exemplary embodiment of a sample mount according to the improved concept.

FIG. 6 shows a schematic top view of a further exemplary sample mount 15. In this sample arrangement, the ratio between reference samples 18 and DUTs 17 in the respective sample sockets 16 is 2:2. This leads to the fact that each of the DUTs 17 is arranged at an equal distance from the associated two reference samples 18. In such an arrangement, each of the DUTs 17 can be calibrated by means of two reference samples 18, leading to a more accurate calibration while maintaining a small footprint of each group of two DUTs 17 and two reference samples 18.

Figure 7:
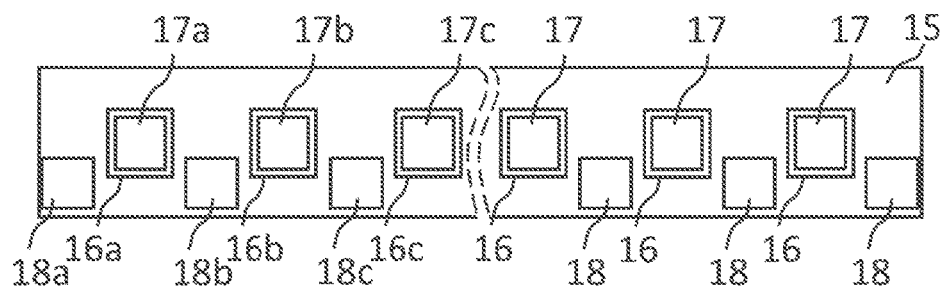
FIG. 7 shows a fourth exemplary embodiment of a sample mount according to the improved concept.

FIG. 7 shows a further exemplary sample mount 15. This linear sample arrangement likewise allows for calibrating each of the DUTs 17 by means of multiple reference samples 18. Due to the constant distance between each of the sample sockets 16 and their adjacent reference samples 18, DUT 17a for example is associated to reference samples 18a and 18b, while DUT 17b is associated to reference samples 18b and 18c. This pattern continues accordingly across the entire sample mount 15.

Figure 8:
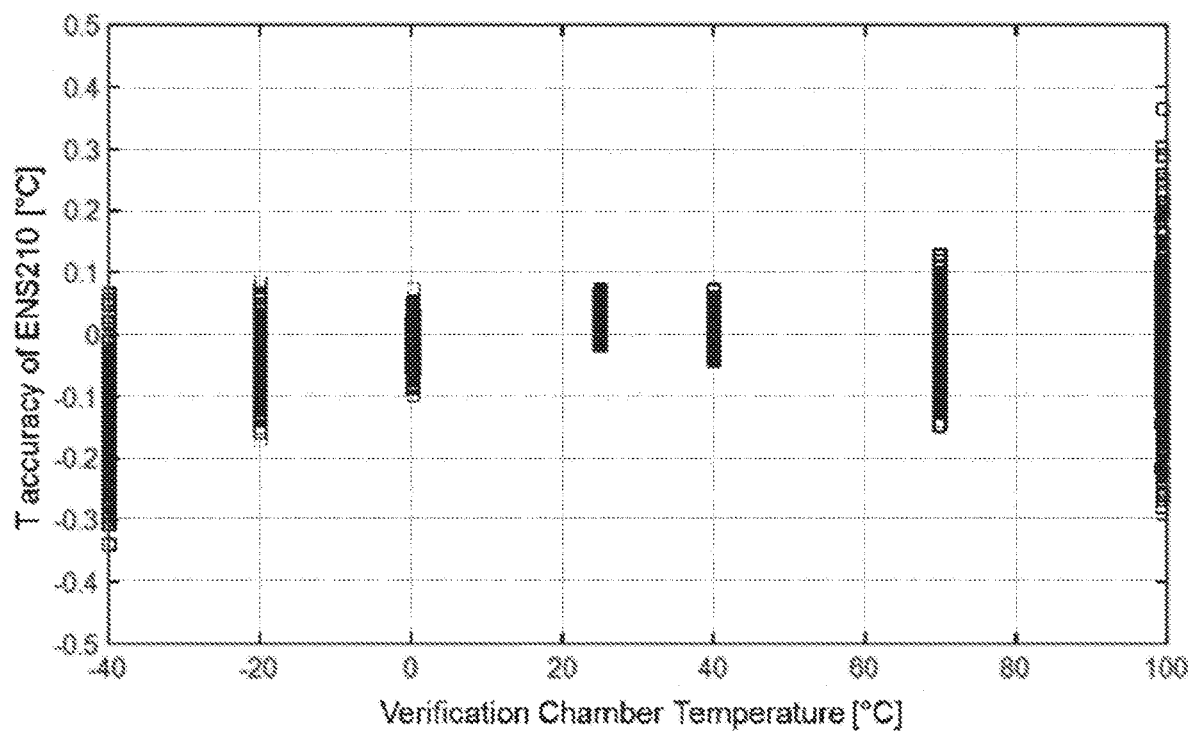
FIG. 8 shows an exemplary result of a temperature sensor calibration according to the improved concept, validated in a lab setup against an independent NIST-traceable reference probe.

FIG. 8 shows the result of an exemplary calibration of 252 DUTs 17 calibrated at a temperature set point of 25° C. of the calibration arrangement 1. The graph shows the accuracy of the newly calibrated devices versus the temperature in a verification chamber. The temperature inside the chamber is determined via an independent NIST-traceable reference probe. For this, the deviation between the DUTs 17 and the temperature reference is evaluated for a temperature range between −40° C. and 100° C. The lowest standard deviation is expectedly observed at the calibration set point of 25° C., resulting in an accuracy of the calibrated temperature sensors of less than 100 mK.

The invention claimed is:

1. A calibration arrangement for temperature sensors comprising:
   a sealable and thermally isolated chamber;
   a socket mount comprising:
     a number of reference samples with each of the reference samples being in thermal contact with the socket mount; and
     a number of sample sockets for devices-under test (DUTs) with each sample socket being arranged in proximity to and associated to at least one of the reference samples;
   a circuit board configured to provide electrical connection to the sample sockets and the reference samples in the socket mount; and
   a thermal chuck in thermal contact with the socket mount and the circuit board,
   wherein the thermal chuck is configured to thermalize the socket mount and the circuit board to a temperature set point, and
   wherein the DUTs are the temperature sensors to be calibrated.

2. The calibration arrangement according to claim 1, wherein the socket mount comprises additional sample sockets for the DUTs, and wherein each of the additional sample sockets is arranged in proximity to and associated to the at least one of the reference samples.

3. The calibration arrangement according to claim 1, wherein each of the sample sockets is arranged at a distance of less than 10 mm from the associated at least one of the reference samples.

4. The calibration arrangement according to claim 1, wherein each of the sample sockets is arranged at the same distance from the associated at least one of the reference samples.

5. The calibration arrangement according to claim 1, wherein the socket mount is made from a material with high thermal conductivity.

6. The calibration arrangement according to claim 1, wherein the arrangement comprises a gas surrounding the socket mount and is configured to thermalize the gas to the temperature set point.

7. The calibration arrangement according to claim 6, wherein the arrangement is configured to operate at a given set point of the gas by pressure and/or relative humidity.

8. The calibration arrangement according to claim 1, wherein the arrangement comprises an evaluation circuit configured to generate, based on a temperature-dependent quantity, a respective set of measurement signals for each of the DUTs placed in the sample sockets, with each set of measurement signals comprising
   a test measurement signal from a distinct one of the DUTs, and
   a reference measurement signal from each of the associated at least one of the reference samples.

9. The calibration arrangement according to claim 8, wherein the evaluation circuit is configured to generate a calibration signal for each set of measurement signals based on a result of a comparison of the test measurement signal and the reference measurement signals of the respective set of measurement signals.

10. The calibration arrangement according to claim 8, wherein the evaluation circuit is configured to generate the sets of measurement signals within a timeframe of less than 10 seconds.

11. The calibration arrangement according to claim 1, wherein the arrangement is further configured to calibrate the DUTs in terms of a gas-dependent parameter.

12. The calibration arrangement according to claim 1, further comprising an apparatus configured to exert a force on the DUTs in the sample sockets in a direction of the sample sockets.

13. The calibration arrangement according to claim 1, wherein each of the sample sockets is arranged at a distance of less than 5 mm from the associated at least one of the reference samples.

14. The calibration arrangement according to claim 1, wherein the arrangement is further configured to calibrate the DUTs in terms of pressure and/or relative humidity.

15. The calibration arrangement according to claim 1, further comprising an apparatus configured to exert a force on the DUTs for creating a thermal contact between the DUTs and the socket mount and an electrical contact between contacts of the DUTs and contacts on the circuit board.

* * * * *